(12) United States Patent
Kokubo

(10) Patent No.: US 6,627,359 B2
(45) Date of Patent: Sep. 30, 2003

(54) PHASE-SHIFT PHOTOMASK MANUFACTURING METHOD AND PHASE-SHIFT PHOTOMASK

(75) Inventor: Haruo Kokubo, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 41 days.

(21) Appl. No.: 09/859,552

(22) Filed: May 17, 2001

(65) Prior Publication Data

US 2001/0044056 A1 Nov. 22, 2001

(30) Foreign Application Priority Data

May 17, 2000 (JP) ..................... P2000-145659

(51) Int. Cl.[7] .............. G03F 9/00; G03C 5/00
(52) U.S. Cl. ........................... 430/5; 430/323
(58) Field of Search ................ 430/5, 322, 323, 430/324, 313

(56) References Cited

U.S. PATENT DOCUMENTS 5,932,377 A * 8/1999 Ferguson et al. ............ 430/5
6,030,729 A * 2/2000 Ito et al. ..................... 430/5
6,410,191 B1 * 6/2002 Nistler et al. ............... 430/5
6,458,495 B1 * 10/2002 Tsai et al. ................... 430/5

* cited by examiner

Primary Examiner—S. Rosasco
(74) Attorney, Agent, or Firm—Ladas & Parry

(57) ABSTRACT

In a method of manufacturing a phase-shift photomask comprising the steps of preparing a substrate transparent to an exposure light having a wavelength $\lambda$ and having a refraction factor n, forming, on the substrate, a pattern including a light-blocking portion blocking the light entering and a light transmission portion transmitting light, and etching the substrate on the transmission portion including a plurality of transmission sections so as to provide adjacent transmission sections, one having a recessed depth d1 and the other one having a recessed depth d2 so as to satisfy an equation of $(d1-d2)=\lambda/2(n-1)$, the etching step comprises a first etching process of a selective dry-etching to the light transmission section of the substrate having the depth d1 so as to provide a predetermined depth D1 after the formation of the light-blocking portion, a second etching process of a wet-etching process to the transmission section having the depth d1 so as to provide a depth of $\lambda/2(n-1)$, and a third etching process of a wet-etching to all the light transmission section having the depth d1 and the depth d2 so as to satisfy an equation of $(d1-d2)=\lambda/2(n-1)$.

12 Claims, 6 Drawing Sheets

PHASE-SHIFT PHOTOMASK MANUFACTURING METHOD AND PHASE-SHIFT PHOTOMASK

BACKGROUND OF THE INVENTION

The present invention relates to a method of manufacturing a photomask and a photomask manufactured thereby, and more particularly, relates to a method of manufacturing a phase-shift (phase-shifting) photomask and a substrate etching-type phase-shift (phase-shifting) photomask manufactured thereby.

In these days, there has been remarkably developed an optical lithography technology for forming more fine resist pattern on a wafer. Such technology includes a phase-shift method, as one means for improving resolution of a projection/exposure device, in which phases of lights passing through two transparent portions adjacent to each other on a photomask are changed respectively.

This method is performed to carry out projection and exposure on the wafer by using a photomask formed so as to satisfy a relationship of $d=\lambda/2(n-1)$ (in which d: film thickness; n: refraction factor; $\lambda$: exposure wave length) as a shifter for inverting a phase on one of adjacent two light transmitting portions (in this meaning, the photomask may be called "phase-shift photomask, hereinlater"), and the light passing the shifter has a phase reverse to that (180° shift) of the transmitting light of the other on of the transmitting portions, so that light intensity at a pattern boundary portion becomes zero (0) and, thereby, the pattern is separated and the resolution is improved.

Examples of photomasks having shapes realizing the high resolution through the phase-shift method of the characters mentioned above are shown in FIG. 4.

FIG. 4A shows a shifter-formation type phase photomask in which a transparent medium 330, which may be called phase shift film or shifter, having a refraction factor different from that of air is provided for one of adjacent two openings 321 (light transmission sections) formed to a substrate 310. In such photomask, it is difficult to pile, with high performance, the phase-shift photomask having the same refraction factor as that of the substrate, and there is a possibility of occurrence of a further problem of multipath refraction at the phase shift film 330.

FIGS. 4B and 4C show other examples, to solve the above mentioned problem, of a phase shift photomask in which the transparent substrate is subjected to an etching working, which maybe called etching-type or etching-type phase-shift photomask.

With reference to FIG. 4B showing the example of etching type phase-shift photomask, an etched portion is formed through an aeolotropic etching process. In such photomask, an amount of light transmitting through the etched portion is reduced in comparison with that transmitting through a non-etched portion, and resist patterns of projection images corresponding to the etched portion and the non-etched portion have dimensions different from each other. This matter is known from the paper 1 (J.Vac.Sci.Technol. B 10(6) (1992) p.3055), R. L. Kostelak, [Exposure characteristics of alternate aperture phase-shifting photomasks fabricated using a subtractive process]).

Furthermore, with reference to FIG. 4C showing a phase-shift photomask, in which an etched portion is formed through an isotropic etching process. In such photomask, resist dimension difference is reduced in comparison with the photomask of FIG. 4B, which is also known from the above paper 1. This reduction is not, however, remarkable. The phase-shift photomask of FIG. 4C may be also called a single-etching type phase-shift photomask, and symbol Wa in FIG. 4C shows a side-etching amount (length).

Further, in the etching-type phase-shift photomask of FIG. 4B, the amount of light transmitting through the etched portion is reduced in comparison with the non-etched portion because of the existence of side walls of the etched portion, thus generating a difference in dimension to the corresponding resist patterns. Particularly, in the case of hole-arrangement-layer, the transmitting light intensities do not become equal and the dimension difference occurs in the resist patterns on the wafer. This phenomenon is remarkably observed for the hole pattern arranged obliquely less than 1.0 $\mu$m.

Further, in general, the etching through the aeolotropic etching process is performed with dry-etching, and on the other hand, the isotropic etching is performed with wet-etching by using heat alkaline (sodium hydroxide) or hydrofluoric acid.

Furthermore, the prior art reference of the paper 2 (SPIE. Vol. 1927 (1933) p.28, Christophe Pierrat and others, [Phase-shifting Photomask Topography Effects on Lithographic Image Quality]) is known. In this paper 2, as a method of correcting or adjusting difference in dimension of a resist of the example shown in FIG. 4B, after etching vertically by an amount corresponding to 180° phase difference through the aeolotropic etching process, which is a state shown in FIG. 4B, the isotropic etching process is effected to all the light transmitting section to thereby form an etching-type phase shift photomask represented by the example of FIG. 4D.

Further, the phase shift photomask shown in FIG. 4D may be called double-surface etching-type phase-shift photomask or double-surface etching-type substrate etching phase-shift photomask.

However, when the phase-shift photomask shown in FIG. 4D is used to obtain effect of correction by the isotropic etching, the side etching amounts Wb1 and Wb2 are made large and a projecting portion having a hood-like shape (hood-like portions, hereinlater) 325 formed to the light-blocking (light-shielding) material (film) 320 are made fragile in structure. The portions of the light-blocking material to which such hood-like portions 325 are formed to be liable to be peeled during a photomask washing process or like and hence become a cause of occurrence of a defective material or product, which will be called "peeled defective" hereinlater, and moreover, the sum of the Wb1 and Wb2 becomes large, so that the entire structure of the light-blocking films 320, whose both sides are subjected to the side etching process, becomes easily peelable.

In these days, the single-surface etching-type phase-shift photomask shown in FIG. 4C and the double-surface etching-type phase-shift photomask shown in FIG. 4D have been used as the etching-type phase-shift photomask as shown in FIG. 4B. However, the single-surface etching-type phase-shift photomask shown in FIG. 4C does not provide the structure for sufficiently solving the problem of the difference in dimension of the resists on the wafer corresponding respectively to the etched portion and non-etched portion. On the other hand, in the double-surface etching-type phase-shift photomask shown in FIG. 4D, the sum of Wb1 and Wb2 becomes large to obtain sufficient dimension correction effect, and the portions corresponding to the portions of Wb1 and Wb2 are liable to be peeled during a photomask washing process or like and hence become a cause of the "peeled defective". Moreover, the entire structure of the light-blocking films 320 becomes easily peelable as mentioned above, thus also providing a problem.

SUMMARY OF THE INVENTION

An object of the present invention is to substantially eliminate defects or drawbacks encountered in the prior art mentioned above and to provide a method of manufacturing a phase-shift photomask, particularly of an etching-type phase-shift photomask manufacturing method, capable of solving the problem of the difference in dimension of resists on a wafer corresponding to etched portion and non-etched portion and also provide a phase-shift photomask manufactured by such method having a structure having strength suitable for a practical use.

This and other objects can be achieved according to the present invention by providing, in one aspect, a method of manufacturing a phase-shift photomask comprising the steps of:

preparing a substrate transparent to an exposure light having a wavelength $\lambda$ and having a refraction factor n;

forming, on the substrate, a pattern including light-blocking portion blocking the light entering and light transmission portion including a plurality of light transmission sections transmitting light; and etching the substrate on the transmission portion so as to provide adjacent transmission sections with recesses one having a depth d1 and the other one having a depth d2 so as to satisfy an equation of $(d1-d2)=\lambda/2(n-1)$, the etching step comprising a first etching process of a dry-etching selective to the light transmission section of the substrate having the depth d1 so as to provide a predetermined depth D1 after the formation of the light-blocking portion, a second etching process of a wet-etching process selective to the transmission section having the depth d1 so as to provide a depth of $\lambda/2(n-1)$, and a third etching process step of a wet-etching to all the light transmission sections having the depth d1 and the depth d2 so as to satisfy an equation of $(d1-d2)=\lambda/2(n-1)$.

In preferred embodiments or examples in this method, the phase-shift photomask is a Levenson-type phase-shift photomask. The phase-shift photomask is a photomask for KrF eximer laser having an exposure light wavelength $\lambda$ of 248 nm. The phase-shift photomask is a photomask for ArF eximer laser having an exposure light wavelength $\lambda$ of 193 nm. The phase-shift photomask is a photomask for F2 eximer laser having an exposure light wavelength $\lambda$ of 157 nm.

An etching depth to the substrate in the third etching process is not less than 10 nm and not more than 50 nm.

Providing that $\delta$ is $[\lambda 2(n-1)]/9$, a length difference $(d1-d2)$ between said depth d1 and said depth d2 is in a range from $[\lambda/2(n-1)]+\delta$ to $[\lambda/2(n-1)]-\delta$.

In another aspect of the present invention, there is also provided a phase-shift photomask comprising;

a substrate transparent to an exposure light having a wavelength $\lambda$ and having a refraction factor n; and a pattern, formed on the substrate, including light-blocking portion blocking the light entering and light transmission portion transmitting light, the light transmission portion including a plurality of light transmission sections in which one of adjacent light transmission sections is etched so as to provide a recess having a depth d1 and the other one of the adjacent light transmission sections is etched so as to provide a recess having a depth d2 so as to satisfy an equation of $(d1-d2)=\lambda/2(n-1)$, wherein portions of the recesses continuous to the light blocking portion are subjected to a wet-etching process with different side-etching amounts to thereby form hood-like portions having different lengths from each other.

In preferred embodiments or examples in this aspect, the phase-shift photomask may be made to various type ones as mentioned above.

Further, a difference, on the side of the light transparent sections, between a length of the hood-like portion of the recess having the depth d1 and a length of the hood-like portion of the recess having the depth d2 may be made to be not less than 0 and not more than 200 nm.

According to the present invention of the characters mentioned above, the problem in dimensions of the resists on the wafer corresponding to the etched portions and non-etched portions can be solved, and therefore, a phase-shift photomask having practical strength and etched structure can be provided.

That is, more in detail, with reference to FIG. 4, which will be explained hereinlater, according to the present invention, there can be solved the problem in dimensions of the resist images on a wafer corresponding to the etched portion and non-etched portion of a single-etching type phase-shift photomask (such as shown in FIG. 4C), and in a case where a sufficient dimension correction effects could be expected, the problem that both side portions of the double-etching type phase-shift photomask are largely side-etched and peeling or cracking is inevitably generated.

More in detail, such functions and effects can be achieved by providing the phase-shift photomask manufacturing method in which the etching step is characterized by comprising a first etching process of a selective dry-etching to the light transmission section of the substrate having the depth d1 so as to provide a predetermined depth D1 in depth of less than $\lambda/2(n-1)$ after the formation of the light-blocking portion, a second etching process of a wet-etching process to the transmission section having the depth d1 so as to provide a depth of $\lambda/2(n-1)$, and a third etching process of a wet-etching to all the light transmission sections having the depth d1 and the depth d2 so as to satisfy an equation of $(d1-d2)=\lambda/2(n-1)$.

By effecting the first and second etching processes, the single-etching type phase-shift photomask as in FIG. 4C, representing a conventional structure, is obtained, and then, by effecting the third etching process, the problem in dimension difference of the resists on the wafer corresponding to the etched portion and non-etched portion occurring in the structure of FIG. 4C can be solved as well as reducing the amount of peeling and cracking to the hood-like portions without requiring an excessively large dimension (Wb) of Wb1 and Wb2 of the side-etching amount (i.e., length of the cantilevered portion) through the wet-etching process to the light transmission section (depth d1) of the light blocking film.

The Levenson type phase-shift photomask will be most effectively applied to a hole pattern oblique arrangement in size of less than 1.0 μm.

Furthermore, the case of the phase-shift photomask for KrF eximer laser having an exposure light wavelength $\lambda$ of 248 nm is effective, the case of the phase-shift photomask for ArF eximer laser having an exposure light wavelength $\lambda$ of 193 nm is more effective, and the case of the phase-shift photomask for F2 eximer laser having an exposure light wavelength λ of 157 nm is specifically effective.

Further, in order to make possible reductions in the side-etching amount in the wet-etching process in the second and third etching processes, it will be desired that the etching amount (depth) D1 in the first etching process is to be an amount causing approximately 50 to 70 degree phase-shift in view of the light intensity regulation (correction). In such case, it is necessary to provide an etching depth in the third etching process to be more than 10 nm in view of the light intensity regulation, but in consideration of the peeling of the light-blocking film, it will be preferred that the etching depth in the third etching process is less than 50 nm in the present invention.

Furthermore, this effect in view of the light intensity regulation will be more effective in the case providing that δ is $[λ/2(n-1)]/9$, a length difference (d1–d2) between the depth d1 and the depth d2 is in a range from $(2m-1)λ/2(n-1)+δ$ to $(2m-1)λ/2(n-1)-δ$. In this equation, m stands for an integer of 1 or above. In this case, it is preferred to use m=1, the length difference (d1–d2) described above is in a range from $λ/2(n-1)+δ$ to $λ/2(n-1)-δ$.

The nature and further characteristic features of the present invention will be made more clear from the following descriptions made with reference to the accompanying drawings.

DESCRIPTION OF THE PREFERRED EMBODIMENTS

A preferred embodiment of a method of manufacturing a phase-shift photomask of the present invention will be described hereunder with reference to the accompanying drawings.

Figure 1A:
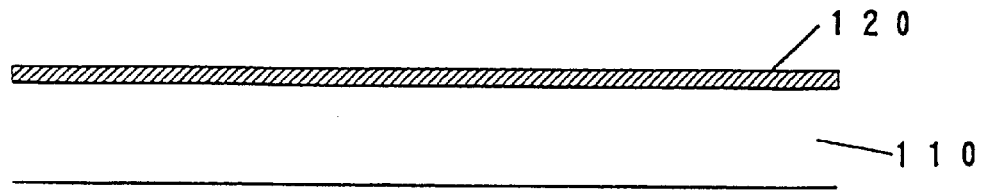
FIG. 1 represents one example of a method of manufacturing a phase-shift photomask according to one embodiment of the present invention and includes FIGS. 1A to 1E showing respective manufacturing steps of the phase-shift photomask, in which FIG. 1E particularly shows an illustrated section of an essential portion of the phase-shift photomask of the present invention.

With reference to FIGS. 1 to 3, a photomask blank shown in FIG. 1A is composed of a substrate 110 and a light-blocking film 120 disposed thereon. The substrate 110 has transparency to an exposure light having a wavelength λ and has a refraction factor n. To such substrate 110, a generally known photo-lithography technology is effected to form a resist film, not shown, having predetermined opening in conformity with a light-blocking portion to be formed. Then, a dry-etching or like is effected for forming the resist film as an etching-resistant photomask, and a light-blocking section 120A formed of the light-blocking film 120 and having a predetermined shape is formed.

Figure 1B:
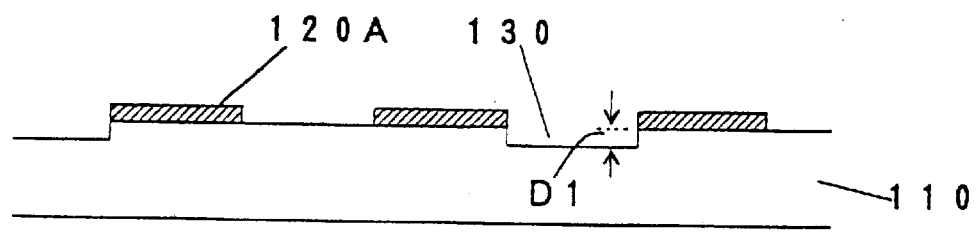

Thereafter, the resist film 120 for forming the light-blocking section 120A is removed and washed in the step shown in FIG. 1B. Further, in a case where the light-blocking film 120 utilizes a chromium oxide nitride, the dry-etching process is performed by using a chlorine gas as an etchant.

As the resist, there is utilized one having a good processability, a predetermined resolution and etching-resistant property, and in the present invention, the resist is not limited to specific one.

In the next step, the surface of the substrate on which the light-blocking film 120 is formed is covered by a resist film, not shown, to which a light transmission section is opened so as to provide a recess having a depth d1. The light transmission section is selectively subjected to the dry-etching process so as to provide a depth D1 in depth of less than $λ/2(n-1)$. In this step, the controlling of this depth is precisely performed by using a phase difference (phase-contrast) measuring device (for example, manufactured by Laser Tec. MPM-248). In this step, aeolotropic dry-etching is effected substantially in only a direction normal to the surface of the substrate. The dry-etching process is effected to the substrate 110 exposed to the opening by using fluorine gas as etchant. Thereafter, the resist film for the dry-etching is removed and the washing treatment is thereafter performed.

Figure 1C:
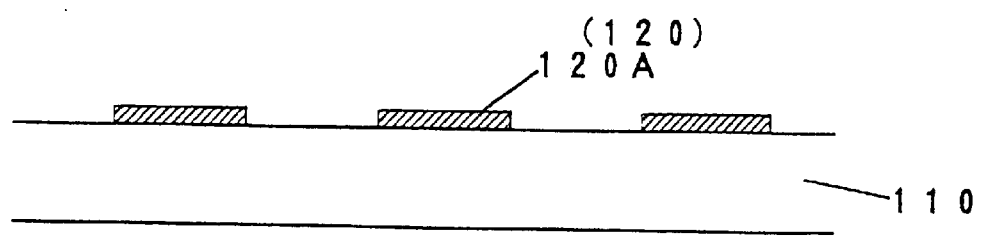

The above step is represented by FIG. 1C. As mentioned above, as this resist, there is utilized one having a good processability, a predetermined resolution and etching-resistant property, and in this embodiment, the resist is not limited to specific one.

Next, the surface of the substrate on which the light-blocking film 120 is formed is covered by a resist film, not shown, to which the opened light transmission section is formed so as to provide the recess having the depth d1. This light transmission section having the depth d1 is selectively subjected to wet-etching process so as to provide a depth d0 of approximately $λ/2(n-1)$.

Figure 1D:
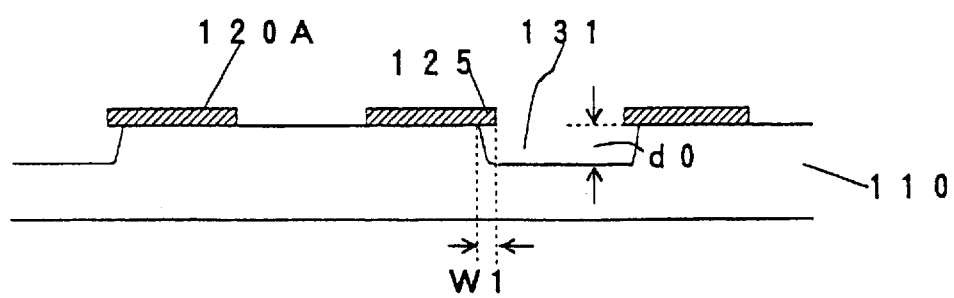

Thereafter, the resist film, not shown, on the substrate surface on which the light-blocking film 120 is disposed, is removed and the surface is washed. This state is shown in FIG. 1D. In this step, the isotropic wet-etching process is effected at substantially equal etching speed in every direction.

Further, in this step, hydrofluoric acid solution is utilized as the etchant for the wet-etching process, and as mentioned above, as this resist, there is utilized one having a good processability, a predetermined resolution and etching-resistant property, and in this embodiment, the resist is not limited to specific one. This step (shown in FIG. 1D) corresponds to the single-etching phase-shift photomask represented by the step of FIG. 4C as prior art technology.

Figure 1E:
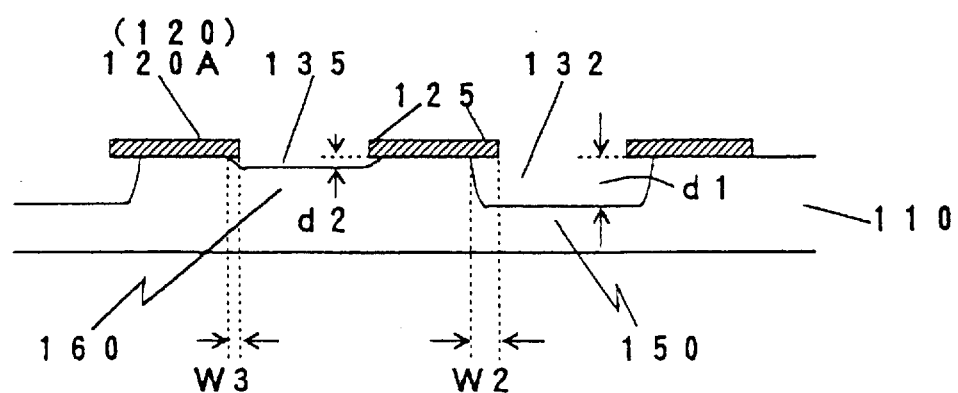

Thereafter, with reference to FIG. 1E, the wet-etching is effected to all the light transmission section on the surface on which the light-blocking film 120 is formed, thus forming adjacent light transmission sections 150 and 160 of the adjacent hole pattern arrangement in which one light transmission section 150 has a recessed depth d1 and the other light transmission section 160 has a recessed depth d2.

Figure 2A:
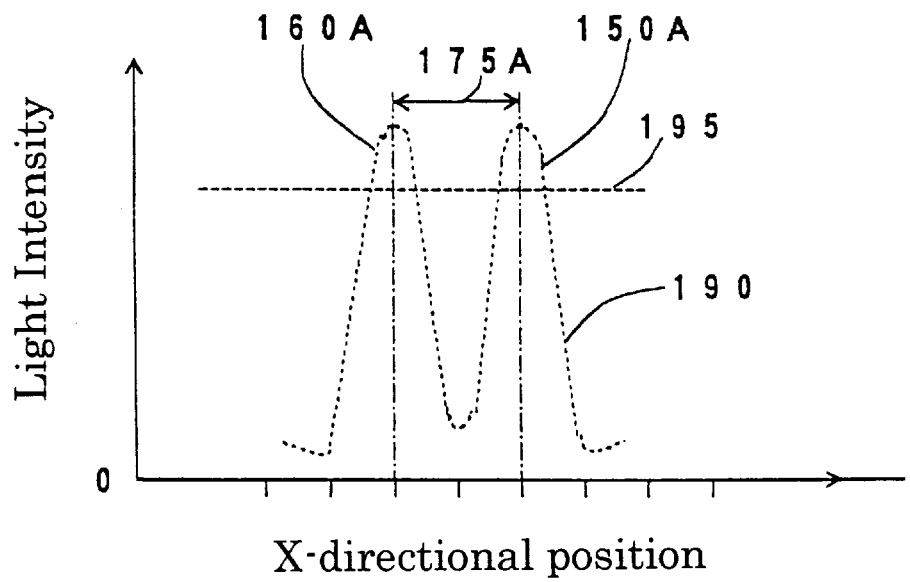
FIG. 2A is a graph showing a light intensity distribution of adjacent light transmission sections (hole portions) on a wafer at a time of applying and projecting a phase-shift photomask structure of the present invention to the hole pattern and FIG. 2B shows a hole pattern arrangement of FIG. 2A.
Figure 2B:
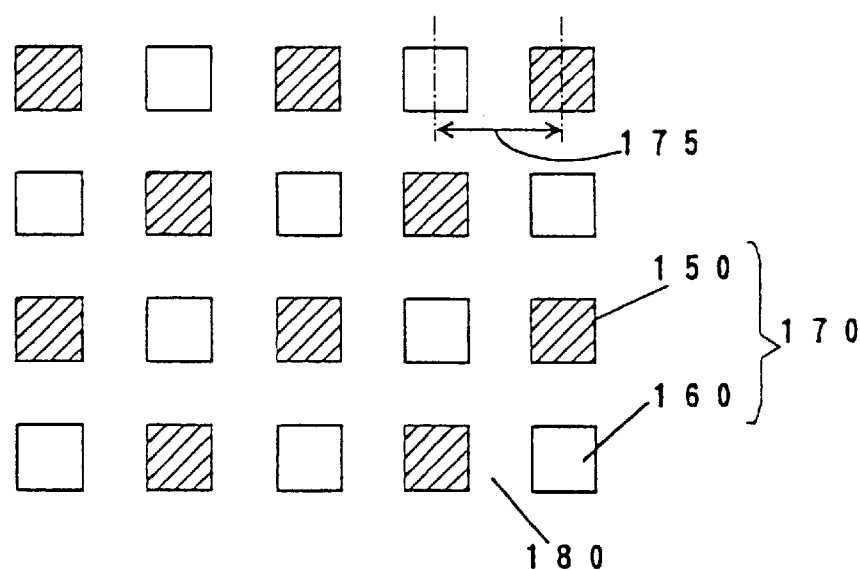

According to the steps mentioned above with reference to FIGS. 1A to 1E, the phase-shift photomask having the hole pattern arrangement shown in FIG. 2B (light transmission section 170) and sectional shape of FIG. 1E can be manufactured.

Hereunder, a preferred embodiment of the phase-shift photomask according to the present invention will be described.

The example, which will be mentioned hereunder, was manufactured in accordance with the method represented by the steps of FIG. 1, and the sectional shape of the phase-shift photomask is shown in FIG. 1E and the hole pattern arrangement thereof is also shown in FIG. 2B, the hole pattern being shown as light transmission section 170. The transparent substrate corresponding to the hole pattern 170 is etched so that one of the adjacent two transmission section has recessed depth of d1 and the other one thereof has recessed depth d2 so as to satisfy the equation $(d1-d2)=\lambda/2(n-1)$.

Furthermore, in the recessed portions of the hole pattern (transmission section) 150 having a depth d1 and the hole pattern (transmission section) 160 having a depth d2, recessed portions continuous to the light-blocking portions are subjected to the wet-etching process with different side etching amounts W2 and W3, and the hood-like portions 125 having different lengths are formed to the light transmission side portions of the light-blocking portion 120A as shown in FIG. 1E and FIG. 2B.

Further, synthetic quartz having refraction factor n of 1.46 is generally utilized as such transparent substrate 110, and chromium or chromium oxide nitride is utilized as such light-blocking film 120.

In the case of using the phase-shift photomask of the structure mentioned above, the hole patterns (light transmission sections) 150 and 160 having the same size and having the recessed depths d1 and d2, respectively, in the arrangement shown in FIG. 2B provide light intensity profiles 190, on the wafer, which are substantially equal to each other as shown in FIG. 2A, when projected, and provide the same width at a predetermined threshold value 195, thus resist images on the wafer being formed with the same dimension. The light intensity on the wafer will be measured, for example, by using 'SHUMILATOR MSM100' of Laser Tec. Corp.

Figure 3A:
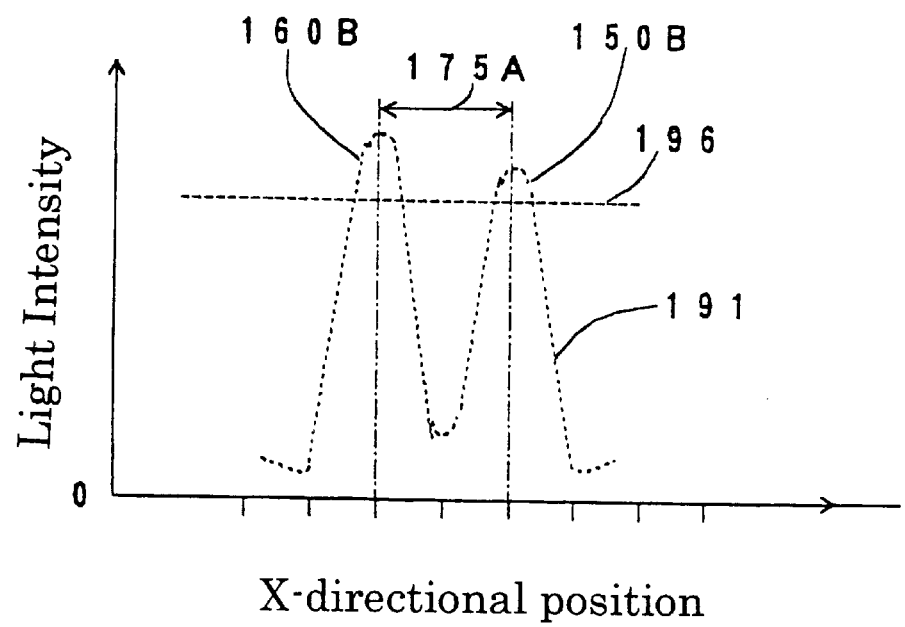
FIG. 3A is a graph corresponding to FIG. 2A in relation to a conventional technology and FIG. 3B shows resist (image) arrangement of FIG. 3A.
Figure 3B:
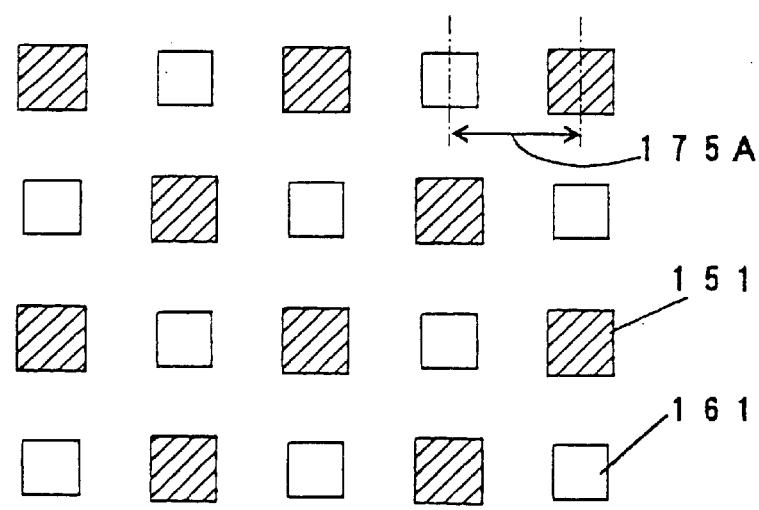
Figure 4A:
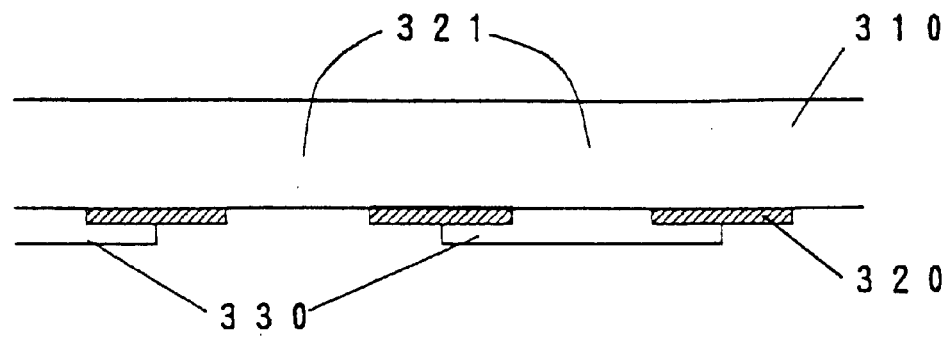
FIG. 4 represents example of prior art and includes FIG. 4A showing an illustrated section of a shifter formation type phase-shift photomask and FIGS. 4B to 4D also showing an illustrated section of essential portions of conventional examples of etching-type phase-shift photomasks.
Figure 4B:
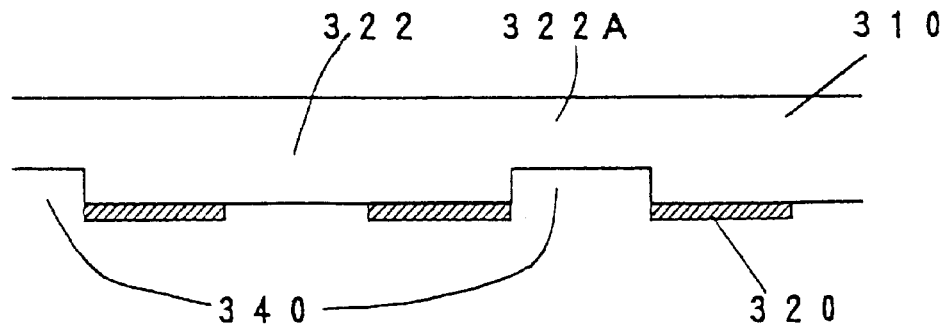
Figure 4C:
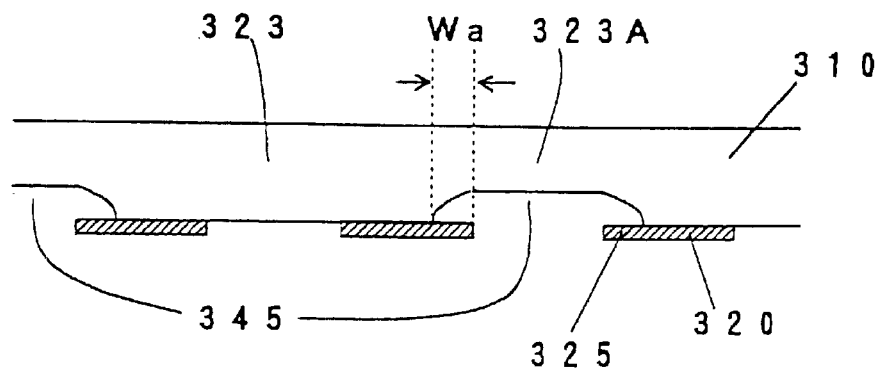
Figure 4D:
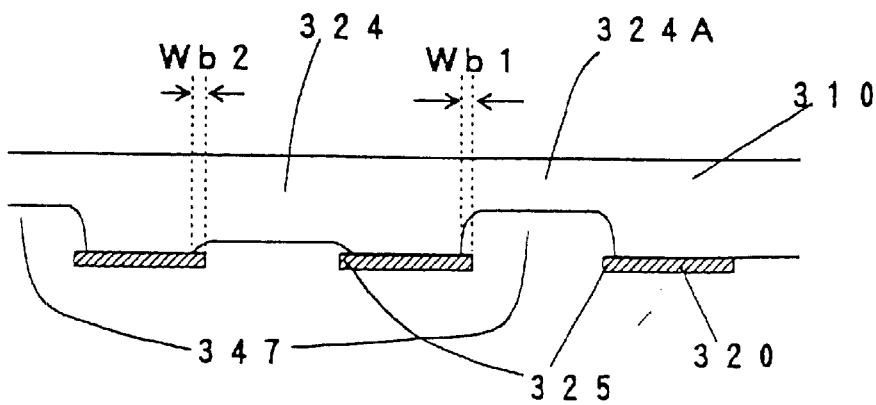

In the state shown in FIG. 1D (which corresponds to the state of single-etching-type phase-shift photomask) of FIG. 4C, as shown in FIG. 3A, the adjacent hole patterns have light intensities different from each other such that the hole pattern to which the etching is effected has a light intensity on the wafer smaller than that of the hole pattern to which the etching is not effected, and the resist images on the wafer of the arrangement of FIG. 2B will be represented by FIG. 3B.

That is, it may be said that the phase-shift photomask of this embodiment is the photomask which was prepared by effecting the light intensity correction to the single-etching-type phase-shift photomask such as shown in FIG. 4C on the wafer.

Furthermore, by setting the difference in the lengths between the hood-like portions on the transmission section side to which the recessed portion having the depth d1 is formed and on the transmission section side to which the recessed portion having the depth d2 is formed to be within a range of more than 0 and less than 200 nm, the wet-etching process can be effectively performed with the same transmission intensity and with no occurrence of the peeling, breaking or like to the hood-like portions.

EXAMPLE

A more preferred example of the present invention, which has been actually manufactured through an experiment, will be described hereunder with reference to the accompanying drawings.

There was prepared one example, by the manufacturing method of the steps represented by FIGS. 1A to 1D, so as to provide a a Levenson-type phase-shift photomask for KrF having the section shown in FIG. 1E and providing the hole pattern arrangement of FIG. 2B.

In the first step, a photomask blank was prepared by preparing a transparent substrate 110 composed of a synthetic quartz substrate (Qz substrate, hereinlater) such as shown in FIG. 1A and forming a light-blocking film 120, on one surface of the transparent substrate 110, by laminating layers of chromium film (thickness of 110 nm) and chromium oxide (thickness of several nm). This state is shown by FIG. 1A.

Next, a resist ZEP (manufactured by Japan ZEON KABUSHIKI KAISHA) was coated on the surface of the light-blocking film 120 of the photomask blank, which was then described by using EB describing apparatus HL800 (manufactured by HITACHI KABUSHIKI KAISHA) and developed by inorganic alkaline developing solution. Next, as shown in FIG. 1B, the chromium oxide and chromium films at portions, at which openings are formed, were subjected to the dry-etching with an etchant having main component of chloride to thereby peel (remove) the resist, and the washing treatment was thereafter performed.

Further, in this step, the opening size of the light-blocking film 120 of the hole pattern (light transmission section) 150 having the recessed depth of d1 was made to be 0.6 $\mu$m (square) and the opening size of the light-blocking film 120 of the hole pattern (light transmission section) 160 having the recessed depth of d2 was made to be 0.6 $\mu$m (square), the pitch having been set to 1.2 $\mu$m.

In the next step shown in FIG. 1C, the surface of the substrate 110, on which the light-blocking film 120 was formed, was covered by a resist film, not shown, having openings corresponding to the light transmission sections having the recessed portion of the depth D1. Then, the dry-etching treatment was selectively performed by using $CF_4$ gas to the light transmission sections having the recessed depth d1 to obtain a predetermined etched depth of 75 nm (which is a depth capable of causing a phase difference of 54° in the transparent substrate 110), and thereafter, the resist film was peeled off and then washed.

The resist film for selectively carrying out this dry-etching treatment was formed by newly applying a resist IP3500 (manufactured by TOKYO OHKA KOGYO KABUSHIKI KAISHA) on the surface of the substrate 110 on which the light-blocking film 120 was formed, describing images by using a laser describing apparatus (ETEC Firm; ALTA3000, for example) and then developing with inorganic alkali developing solution (developer).

In this step, thereafter, while exactly measuring the etching depth by using a phase difference measuring apparatus (Laser Tec. Corp.; MPM-248), the dry-etching process was carried out and stopped when the etching depth has reached about 75 nm at which the 54° phase difference occurs in the transparent substrate 110.

In the next step shown in FIG. 1D, the resist IP3500 was newly applied for the purpose of carrying out the wet-etching process to the recessed transmission section so as to obtain the depth dl of about 245 nm capable of causing the phase difference of 180° in the transparent substrate 110. Then, the resist applied surface is described by using the laser describing apparatus and developed thereafter with the inorganic alkali developing solution, thus forming the resist film provided with openings only at the light transmission sections having the recessed depth dl. Thereafter, the wet-etching process was carried out by using hydrofluoric acid, thus obtaining the desired depth d0 of about 245 nm capable of causing the phase difference of 180° in the transparent substrate 110. The resist was then peeled off, removed and washed. In this step shown in FIG. 1D, the side-etching amount W1 was 170 nm.

Next, with reference to FIG. 1E, the full-surface wet-etching using the hydrofluoric acid was carried out to perform the side etching to the shifted-portion of about 30 nm and non-shifted-portion. During the process, the desired etching (etched) amount was obtained by utilizing a tracer-type difference measuring apparatus or an atomic force microscope. The measured side-etching amount W2 and side-etching amount W3 were 200 nm and 30 nm, respectively.

COMPARATIVE EXAMPLE

In order to ensure the advantageous functions and effects of the present invention as represented by the above Example, an experiment was further effected to obtain a Comparative Example, which is as follows.

The comparative example is a phase-shift photomask which was manufactured through the same steps of the method represented by FIG. 1 as in the above Example, and the photomask of this Comparative Example showed the same sectional shape as that of FIG. 1D and the hole pattern arrangement shown in FIG. 2B. That is, the photomask was manufactured through substantially the same steps shown in FIGS. 1A to 1D as those for the Example mentioned above, but differs in that the light transmission sections were treated through the dry-etching process to obtain the depth of about 45 nm for causing the phase-shift of 32° in the transparent substrate 110 and through the wet-etching process to obtain the depth of about 245 nm for causing the phase-shift of 180° in the transparent substrate 110, thus manufacturing the phase-shift photomask of this Comparative Example.

The state of FIG. 1D may correspond to the state of FIG. 4C showing the single-etching type phase-shift photomask, and in the photomask of the Comparative Example of FIG. 1D, the side-etching amount (W1 in FIG. 1D) was 200 nm through the wet-etching process to obtain the depth of about 245 nm for causing the phase-shift of 180° in the transparent substrate 110 after the dry-etching process.

The side-etching amount W2 of the phase-shift photomask of the Example and the side-etching amount W1 of the phase-shift photomask of the Comparative Example are both 200 nm. The light intensities on the wafer of the adjacent hole patterns (light transmission sections) 150 and 160 shown in FIG. 2B were investigated with respect to both the Example of the present invention and the Comparative Example.

In the case of the phase-shift photomask of the Example, the light intensity profile on the wafer is shown in FIG. 2A, in which the hole patterns 150 and 160 accord with each other and the light intensity profiles 150A and 160A of the adjacent hole patterns have substantially no difference.

On the other hand, in the case of the phase-shift photomask of the Comparative Example, the light intensity profiles on the wafer of the hole patterns 150 and 160 provide a large difference in comparison with that of the Example mentioned above. Further, the light intensities on the wafer were measured by using "SIMULATOR MSM100" of Laser TEC. Corp.

This means the following facts.

The side-etching amount (i.e. length of hood-like portion 125 in FIG. 1E) in the phase-shift photomask of the Example according to the present invention was made smaller than the side-etching amount of the phase-shift photomask in the Comparative Example, and in the case where the treatment has been ended at the time of manufacturing the phase-shift photomask of the Example, in the step shown in FIG. 1D (W1 is 170 nm), the light intensity profile of the photomask at that time could be obtained on the same wafer as that on which the light intensity profile was corrected.

Further, in the step shown in FIG. 1D of the manufacturing of the phase-shift photomask of the Example, the side-etching amount W1 is 170 nm, and with respect to the photomask whose treatment has been ended at this step of FIG. 1D, the light intensity profiles 150B and 160B of the adjacent hole patterns corresponding to the hole patterns 150 and 160 were clearly observed, thus having been not practically usable.

As mentioned hereinabove, according to the present invention, the problem of the difference in dimension of the resists on the wafer corresponding to the etched portion and non-etched portion can be effectively solved, and moreover, the phase-shift photomask having sufficient intensity can be provided.

The entire disclosure of Japanese Patent Application No. 2000-145659 filed on May 17, 2000 including the specification, claims, drawings and summary is incorporated herein by reference in its entirety.

What is claimed is:

1. A method of manufacturing a phase-shift photomask comprising the steps of:

preparing a substrate transparent to an exposure light having a wavelength λ and having a refraction factor n;

forming, on the substrate, a pattern including a light-blocking portion blocking the light entering and a light transmission portion including a plurality of transmission sections transmitting light; and etching the substrate on the transmission portion so as to provide adjacent transmission sections, one section having a recess of depth d1 and a side etching dimension W2 and the other section having a recess of depth d2 and a side etching dimension W3 so as to satisfy the equation (d1−d2)=λ/2(n−1), said etching step comprising a first etching process of a dry-etching selective to the light transmission section of the substrate where the recess having the depth d1 is shaped and configured so as to provide a predetermined depth D1 after the formation of the light-blocking portion, a second etching process of a wet-etching process selective to the same transmission section so as to provide a depth d0 satisfying the equation d0=λ/2 (n−1) and a side etching dimension W1, and a third etching process of a wet-etching to all the light transmission section to form the recesses having the depth d1 and side etching dimension W2 and the depth d2 and the side etching dimension W3 in the adjacent transmission sections so as to satisfy the equations (d1−d2)=λ/2(n−1) and W2>W3.

2. A phase-shift photomask manufacturing method according to claim 1, wherein said phase-shift photomask is a Levenson-type phase-shift photomask.

3. A phase-shift photomask manufacturing method according to claim 1, wherein said phase-shift photomask is a photomask suitable for a KrF eximer laser having an exposure light wavelength λ of 248 nm.

4. A phase-shift photomask manufacturing method according to claim 1, wherein said phase-shift photomask is a photomask suitable for an ArF eximer laser having an exposure light wavelength $\lambda$ of 193 nm.

5. A phase-shift photomask manufacturing method according to claim 1, wherein said phase-shift photomask is a photomask suitable for a $F_2$ eximer laser having an exposure light wavelength $\lambda$ of 157 nm.

6. A phase-shift photomask manufacturing method according to claim 1, wherein the etching depth to the substrate in said third etching process is not less than 10 nm and not more than 50 nm.

7. A phase-shift photomask manufacturing method according to claim 1, wherein providing that $\delta$ is $[\lambda/2(n-1)]/9$, the difference (d1−d2) between said depth d1 and said depth d2 is in a range from $[\lambda/2(n-1)]+\delta$ to $[\lambda/2(n-1)]-\delta$.

8. A phase-shift photomask comprising;

a substrate transparent to an exposure light having a wavelength $\lambda$ and having a refraction factor n; and a pattern formed on the substrate and including a light-blocking portion blocking the light entering and a light transmission portion transmitting light, said light transmission portion including a plurality of light transmission sections in which one of adjacent light transmission sections is etched so as to provide a recess having a depth d1 and the other one of the adjacent light transmission sections is etched so as to provide a recess having a depth d2 so as to satisfy the equation (d1−d2)=$\lambda/2(n-1)$, wherein portions of said recesses continuous to the light blocking portion are subjected to a wet-etching process providing different side-etching amounts to thereby form cantilevered portions having different lengths from each other.

9. A phase-shift photomask according to claim 8, wherein said phase-shift photomask is a Levenson-type phase-shift photomask.

10. A phase-shift photomask according to claim 8, wherein said phase-shift photomask is a photomask suitable for a KrF eximer laser having an exposure light wavelength $\lambda$ of 248 nm.

11. A phase-shift photomask according to claim 8, wherein said phase-shift photomask is a photomask suitable for an ArF eximer laser having an exposure light wavelength $\lambda$ of 193 nm.

12. A phase-shift photomask according to claim 8, wherein said phase-shift photomask is a photomask suitable for a $F_2$ eximer laser having an exposure light wavelength $\lambda$ of 157 nm.

* * * * *